(12) United States Patent
Li

(10) Patent No.: US 10,964,818 B2
(45) Date of Patent: Mar. 30, 2021

(54) SEMICONDUCTOR DEVICE DOPED FROM A DIFFUSED LAYER

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/701,975

(22) Filed: Dec. 3, 2019

(65) Prior Publication Data
US 2020/0105920 A1 Apr. 2, 2020

Related U.S. Application Data

(62) Division of application No. 16/021,382, filed on Jun. 28, 2018, now Pat. No. 10,573,752.

(30) Foreign Application Priority Data
Jun. 29, 2017 (CN) .......................... 201710513852.4

(51) Int. Cl.
*H01L 29/78* (2006.01)
*H01L 23/532* (2006.01)
(Continued)

(52) U.S. Cl.
CPC ...... *H01L 29/785* (2013.01); *H01L 21/02362* (2013.01); *H01L 21/2255* (2013.01); *H01L 21/324* (2013.01); *H01L 21/76832* (2013.01); *H01L 21/823418* (2013.01); *H01L 21/823814* (2013.01); *H01L 21/823821* (2013.01); *H01L 23/5329* (2013.01); *H01L 27/0924* (2013.01);
(Continued)

(58) Field of Classification Search
CPC ...................................................... H01L 29/785
USPC ...................................................... 257/401
See application file for complete search history.

(56) References Cited

U.S. PATENT DOCUMENTS 8,440,552 B1 5/2013 Chen
2013/0149829 A1 6/2013 Nandakumar
(Continued)

*Primary Examiner* — Ajay Arora
(74) *Attorney, Agent, or Firm* — Brinks Gilson & Lione

(57) ABSTRACT

The present disclosure relates to the technical field of semiconductors, and discloses a semiconductor device and a manufacturing method therefor. The manufacturing method includes: providing a substrate; forming a source and a drain that are at least partially located in the substrate; forming a diffused layer on a surface of at least one of the source or the drain, where a conductivity type of the diffused layer is the same conductivity type as the source and the drain, and a doping density of a dopant contained in the diffused layer is separately greater than doping densities of dopants contained in the source and the drain; and performing an annealing processing after the diffused layer is formed. The present disclosure can increase a doping density at a surface of a source and/or a drain, helping to reduce a contact resistance, thereby improving performance of a device.

7 Claims, 11 Drawing Sheets

(51) Int. Cl.
  *H01L 21/8234* (2006.01)
  *H01L 21/324* (2006.01)
  *H01L 21/02* (2006.01)
  *H01L 21/768* (2006.01)
  *H01L 21/8238* (2006.01)
  *H01L 29/66* (2006.01)
  *H01L 21/225* (2006.01)
  *H01L 27/092* (2006.01)
  *H01L 29/417* (2006.01)

(52) U.S. Cl.
  CPC .. *H01L 29/66795* (2013.01); *H01L 29/41791* (2013.01)

(56) References Cited

U.S. PATENT DOCUMENTS

2018/0108574 A1* 4/2018 Li .................. H01L 21/823821
2018/0174922 A1   6/2018 Chiu \* cited by examiner

SEMICONDUCTOR DEVICE DOPED FROM A DIFFUSED LAYER

RELATED APPLICATIONS

The present application is a divisional of U.S. application Ser. No. 16/021,382, filed Jun. 28, 2018 (still pending), which claims priority to Chinese Patent Appln. No. 201710513852.4, filed Jun. 29, 2017, the entirety of each are incorporated by reference.

BACKGROUND

Technical Field

The present disclosure relates to the technical field of semiconductors, and in particular, to a semiconductor device and a manufacturing method therefor.

Related Art

In the prior art, in a process of manufacturing a source contact and a drain contact of a metal oxide semiconductor (MOS) device, contact resistances between contacts and a source and a drain, respectively, should be reduced when possible. At present, the contact resistances may be reduced by using many methods such as reducing an electronic schottky barrier Height (eSBH) or increasing a doping density.

Usually, a dopant segregated schottky (DSS) injection process may be used to dope surfaces of the source and the drain in a larger density, so as to further reduce the contact resistances. However, an ion injection process easily damages the surfaces of the source and the drain, which does not help to improve performances of a device. In addition, this doping method further needs an additional mask or photoetching process. For example, during a process of forming a p-channel metal oxide semiconductor (PMOS) device and an n-channel metal oxide semiconductor (NMOS) device, for example, an NMOS portion first needs to be covered by a mask, and surfaces of a source and a drain of a PMOS portion are doped in a large density. After the mask is removed, the PMOS portion is covered by another mask, and surfaces of a source and a drain of the NMOS portion are doped in a large density. Therefore, in such a case, two masks or photoetching processes need to be added. This increases complexity of the process, and also increases the costs.

SUMMARY

A technical problem addressed by the present disclosure is: providing a method for manufacturing a semiconductor device, so as to reduce a contact resistance of a source and/or a drain.

In a first aspect of the present disclosure, a method for manufacturing a semiconductor device is provided, including: providing a substrate; forming a source and a drain that are at least partially located in the substrate; forming a diffused layer on a surface of at least one of the source or the drain, where a conductivity type of the diffused layer is same conductivity type as the source and the drain, and a doping density of a dopant contained in the diffused layer is separately greater than doping densities of dopants contained in the source and the drain; and performing an annealing processing after the diffused layer is formed.

In some implementations, the conductivity type of the source and the drain is N-typed, and the material of the diffused layer includes a phosphorus-doped silicon dioxide; or the conductivity type of the source and the drain is P-typed, and the material of the diffused layer includes a boron-doped silicon dioxide.

In some implementations, the annealing processing includes: a first annealing processing; and a second annealing processing after the first annealing processing is performed.

In some implementations, the first annealing processing is a spike annealing; and the second annealing processing is a laser annealing.

In some implementations, an annealing temperature of the spike annealing is from 900° C. to 1050° C.; and an annealing temperature of the laser annealing is from 1100° C. to 1300° C.

In some implementations, before the annealing processing is performed, the method further includes: forming a barrier layer on the diffused layer.

In some implementations, the method further includes: forming, on the barrier layer, an interlayer dielectric layer covering the source and the drain; and forming a source contact and a drain contact that pass through the interlayer dielectric layer, where the source contact is connected to the source, and the drain contact is connected to the drain.

In some implementations, the substrate includes: a semiconductor layer and a semiconductor fin on the semiconductor layer; and in the step of forming the source and the drain, the source and the drain are at least partially formed in the semiconductor fin, separately.

In implementations of the foregoing manufacturing method, a diffused layer is formed on surfaces of the formed source and/or drain. A conductivity type of the diffused layer is same to conductivity types of the source and the drain, and a doping density of a dopant contained in the diffused layer is separately greater than doping densities of dopants contained in the source and the drain. Subsequently, an annealing processing is performed. As a result, the dopant in the diffused layer diffuses towards the surfaces of the source and/or the drain, so as to increase doping densities at the surfaces of the source and/or the drain. This helps to reduce a contact resistance, thereby improving performance of a device.

Further, in the foregoing manufacturing method, surface doping for the source and/or the drain is achieved by diffusion, and is not achieved through an ion injection as in the prior art. Therefore, the foregoing method in the present disclosure can reduce damages caused by the ion injection to the source and/or the drain, thereby improving performance of a device.

In another aspect of the present disclosure, a method for manufacturing a semiconductor device is provided, including: providing a substrate, where the substrate includes a first semiconductor area and a second semiconductor area that are isolated, and a conductivity type of the first semiconductor area is contrary to that of the second semiconductor area; forming a first source and a first drain that are at least partially located in the first semiconductor area; forming a first diffused layer on surfaces of the first source and the first drain, where a conductivity type of the first diffused layer is the same conductivity type as the first source and the first drain, and a doping density of a dopant contained in the first diffused layer is separately greater than doping densities of dopants contained in the first source and the first drain; forming a first barrier layer on the first diffused layer; forming a second source and a second drain that are at least partially located in the second semiconductor area; and performing an annealing processing.

In some implementations, before the annealing processing is performed, the method further includes: forming a second diffused layer on surfaces of the second source and the second drain, where a conductivity type of the second diffused layer is the same conductivity type as the second source and the second drain, and a doping density of a dopant contained in the second diffused layer is separately greater than doping densities of dopants contained in the second source and the second drain; and forming a second barrier layer on the second diffused layer.

In some implementations, the conductivity type of the first source and the first drain is P-typed, and the material of the first diffused layer includes a boron-doped silicon dioxide; and the conductivity type of the second source and the second drain is N-typed, and the material of the second diffused layer includes a phosphorus-doped silicon dioxide.

In some implementations, the annealing processing includes: a first annealing processing; and a second annealing processing after the first annealing processing is performed.

In some implementations, the first annealing processing is a spike annealing; and the second annealing processing is a laser annealing.

In some implementations, an annealing temperature of the spike annealing is from 900° C. to 1050° C.; and an annealing temperature of the laser annealing is from 1100° C. to 1300° C.

In some implementations, in the step of forming the second diffused layer, the second diffused layer is further formed on the first barrier layer above the first source and the first drain.

In some implementations, the method further includes: forming, on the second barrier layer, an interlayer dielectric layer covering the first source, the first drain, the second source, and the second drain; and forming a first source contact, a first drain contact, a second source contact, and a second drain contact that pass through the interlayer dielectric layer, where the first source contact is connected to the first source, the first drain contact is connected to the first drain, the second source contact is connected to the second source, and the second drain contact is connected to the second drain.

In some implementations, in the step of providing a substrate, the first semiconductor area is a first semiconductor fin, the second semiconductor area is a second semiconductor fin, and the substrate further includes a semiconductor layer, where both the first semiconductor fin and the second semiconductor fin are on the semiconductor layer; in the step of forming the first source and the first drain, the first source and the first drain are at least partially formed in the first semiconductor fin, separately; and in the step of forming the second source and the second drain, the second source and the second drain are at least partially formed in the second semiconductor fin, separately.

In implementations of the foregoing manufacturing method, sources and drains of two different semiconductor devices are formed. A first source and a first drain are formed in a first semiconductor area, and a second source and a second drain are formed in a second semiconductor area. A first diffused layer is formed on surfaces of the first source and the first drain, a first barrier layer is formed on the first diffused layer, and subsequently, an annealing processing is performed. Therefore, a dopant in the first diffused layer diffuses towards the surfaces of the first source and the first drain, so as to increase doping densities at the surfaces of the first source and the first drain. This helps to reduce a contact resistance, thereby improving performance of a device.

Further, in implementations of the manufacturing method described above, surface doping for each source and drain is achieved by diffusion, and is not achieved through an ion injection as in the prior art. Therefore, implementations of the foregoing method in the present disclosure can reduce damage caused by the ion injection to each source and drain, thereby improving performance of a device.

Further, compared with the prior art, implementations of the foregoing manufacturing method in the present disclosure save two masks or photoetching processes, so as to simplify the process and reduce the costs.

In yet another aspect of the present disclosure, a semiconductor device is provided, including: a substrate; a source and a drain that are at least partially located in the substrate; and a diffused layer on a surface of at least one of the source or the drain, where a conductivity type of the diffused layer is the same conductivity type as the source and the drain, and a doping density of a dopant contained in the diffused layer is separately greater than doping densities of dopants contained in the source and the drain.

In some implementations, the conductivity type of the source and the drain are N-typed, and the material of the diffused layer includes a phosphorus-doped silicon dioxide; or the conductivity type of the source and the drain are P-typed, and the material of the diffused layer includes a boron-doped silicon dioxide.

In some implementations, the semiconductor device further includes: a barrier layer on the diffused layer.

In some implementations, the semiconductor device further includes: an interlayer dielectric layer that is formed on the barrier layer and that covers the source and the drain; and a source contact and a drain contact that pass through the interlayer dielectric layer, where the source contact is connected to the source, and the drain contact is connected to the drain.

In some implementations, the substrate includes: a semiconductor layer and a semiconductor fin on the semiconductor layer, where the source and the drain are at least partially located in the semiconductor fin, separately.

In implementations of the foregoing semiconductor device, a dopant in a diffused layer may diffuse to surfaces of a source and/or a drain, so as to increase doping densities of the source and/or the drain. Therefore, a contact resistance between a source contact and the source and/or a contact resistance between a drain contact and the drain may be reduced, thereby improving performance of a device.

In a further aspect of the present disclosure, a semiconductor device is provided, including: a substrate, where the substrate includes a first semiconductor area and a second semiconductor area that are isolated, and a conductivity type of the first semiconductor area is contrary to that of the second semiconductor area; a first source and a first drain that are at least partially located in the first semiconductor area; a first diffused layer on surfaces of the first source and the first drain, where a conductivity type of the first diffused layer is the same conductivity type as the first source and the first drain, and a doping density of a dopant contained in the first diffused layer is separately greater than doping densities of dopants contained in the first source and the first drain; a first barrier layer on the first diffused layer; and a second source and a second drain that are at least partially located in the second semiconductor area.

In some implementations, the semiconductor device further includes: a second diffused layer on surfaces of the second source and the second drain, where a conductivity type of the second diffused layer is the same conductivity type as the second source and the second drain, and a doping density of a dopant contained in the second diffused layer is separately greater than doping densities of dopants contained in the second source and the second drain; and a second barrier layer on the second diffused layer.

In some implementations, the conductivity type of the first source and the first drain is P-typed, and the material of the first diffused layer includes a boron-doped silicon dioxide; and the conductivity type of the second source and the second drain is N-typed, and the material of the second diffused layer includes a phosphorus-doped silicon dioxide.

In some implementations, the second diffused layer is further formed on the first barrier layer above the first source and the first drain.

In some implementations, the semiconductor device further includes: an interlayer dielectric layer that is formed on the second barrier layer and that covers the first source, the first drain, the second source, and the second drain; and a first source contact, a first drain contact, a second source contact, and a second drain contact that pass through the interlayer dielectric layer, where the first source contact is connected to the first source, the first drain contact is connected to the first drain, the second source contact is connected to the second source, and the second drain contact is connected to the second drain.

In some implementations, the first semiconductor area is a first semiconductor fin, and the second semiconductor area is a second semiconductor fin; the substrate further includes a semiconductor layer, where both the first semiconductor fin and the second semiconductor fin are on the semiconductor layer; the first source and the first drain are at least partially located in the first semiconductor fin, separately; and the second source and the second drain are at least partially located in the second semiconductor fin, separately.

In implementations of the foregoing semiconductor device, a dopant in a first diffused layer diffuses towards surfaces of a first source and a first drain, so as to increase doping densities at the surfaces of the first source and the first drain. As a result, a contact resistance between a source or a drain and a corresponding contact is reduced, thereby improving performance of a device.

The exemplary embodiments and implementations of the present disclosure are described in detail below with reference to the accompanying drawings, so that other features and advantages of the present disclosure become clear.

BRIEF DESCRIPTION OF THE DRAWINGS

The accompanying drawings which constitute a part of the specification illustrate embodiments and implementations of the present disclosure and, together with the description, serve to explain the principles of the present disclosure.

With reference to the accompanying drawings, the present disclosure may be understood more clearly according to the following detailed description, where.

DETAILED DESCRIPTION

Exemplary embodiments and implementations of the present disclosure are described in detail with reference to the accompanying drawings. It should be noted that unless being described in detail, relative layouts, mathematical expressions, and numeric values of components and steps described in these implementations do not limit the scope of the present disclosure.

Meanwhile, it should be understood that for ease of description, sizes of the parts shown in the accompanying drawings are not drawn according to an actual proportional relationship.

The following description about at least one exemplary embodiment actually is only illustrative, and should not be used as any limitation on the present disclosure and applications or uses of the present disclosure.

Technologies, methods, and devices that are known by a person of ordinary skill in the related fields may not be discussed in detail. However, in proper cases, the technologies, methods, and devices should be considered as a part of the authorized description.

In all examples shown and discussed herein, any specific value should be explained as for illustration purposes only rather than as a limitation. Therefore, other examples of the exemplary embodiments and implementations may have different values.

It should be noted that similar numerals and letters represent similar items in the following accompanying drawings. Therefore, once an item is defined in a figure, the item needs not to be further discussed in the subsequent figures.

Figure 1:
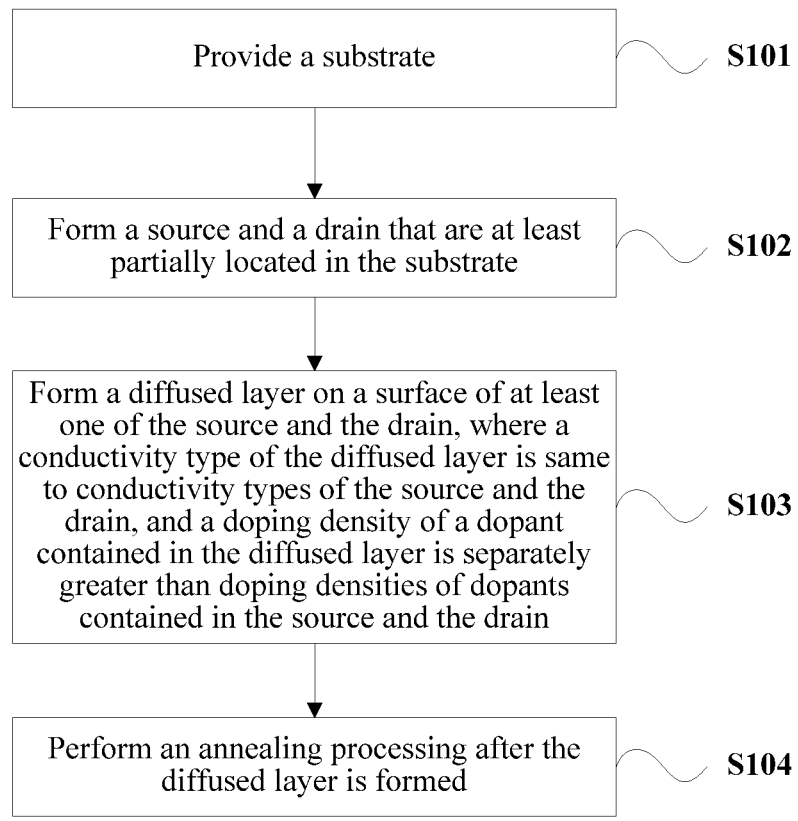
FIG. 1 is a flowchart of a method for manufacturing a semiconductor device.

FIG. 1 is a flowchart of a method for manufacturing a semiconductor device.

In step S101: Provide a substrate. In some implementations, the substrate may be a substrate that is configured to form a Fin Field-Effect Transistor (FinFET) device. For example, the substrate may include: a semiconductor layer and a semiconductor fin on the semiconductor layer. In another implementation, the substrate may be a substrate that is configured to form a planar device.

In step S102: Form a source and a drain that are at least partially located in the substrate. For example, in step S102, the source and the drain may be at least partially formed in the semiconductor fin, separately.

In step S103: Form a diffused layer on a surface of at least one of the source or the drain, where a conductivity type of the diffused layer is the same conductivity type as the source and the drain, and a doping density of a dopant contained in the diffused layer is separately greater than doping densities of dopants contained in the source and the drain. For example, the diffused layer may be formed on surfaces of the source and the drain. The doping density of the dopant contained in the diffused layer is greater than the doping density of the dopant contained in the source, and the doping density of the dopant contained in the diffused layer is greater than the doping density of the dopant contained in the drain.

In some implementations, the conductivity types of the source and the drain may be N-typed, and the dopant of the diffused layer is an N-typed dopant. For example, the material of the diffused layer may include a phosphorus-doped silicon dioxide (or referred to as phosphorosilicate glass).

In other implementations, the conductivity type of the source and the drain may be P-typed, and the dopant of the diffused layer is a P-typed dopant. For example, the material of the diffused layer may include a boron-doped silicon dioxide (or referred to as borosilicate glass).

In step S104: Perform an annealing processing after the diffused layer is formed. The annealing processing may enable the dopant in the diffused layer to diffuse towards surfaces of the source and/or the drain, so as to increase doping densities at the surfaces of the source and/or the drain. This helps to reduce the contact resistance when a source contact and/or a drain contact is formed subsequently.

In implementations of the manufacturing method described above, a diffused layer is formed on surfaces of a formed source and/or drain. A conductivity type of the diffused layer is the same conductivity type as the source and the drain, and a doping density of a dopant contained in the diffused layer is separately greater than doping densities of dopants contained in the source and the drain. Subsequently, an annealing processing is performed. As a result, the dopant in the diffused layer diffuses towards the surfaces of the source and/or the drain, so as to increase doping densities at the surfaces of the source and/or the drain. This helps to reduce a contact resistance, thereby improving performance of a device.

In addition, in implementations of the foregoing manufacturing method described above, surface doping for the source and/or the drain is achieved by diffusion, and is not achieved through an ion injection as in the prior art. Therefore, implementations of the foregoing method in the present disclosure can reduce damage caused by the ion injection to the source and/or the drain, thereby improving performance of a device.

In some implementations, the annealing processing may include a first annealing processing. For example, the first annealing processing may be a spike annealing. For example, an annealing temperature of the spike annealing may be from 900° C. to 1050° C. (for example, 1000° C.). The first annealing processing helps to enable the dopant in the diffused layer to diffuse towards the surfaces of the source and/or the drain, so as to increase the doping densities at the surfaces of the source and/or the drain. In addition, the first annealing processing may further help to activate the dopant that diffuses to the source and the drain.

Optionally, the annealing processing may further include a second annealing processing after the first annealing processing is performed. For example, the second annealing processing may be a laser annealing. For example, an annealing temperature of the laser annealing may be from 1100° C. to 1300° C. (for example, 1200° C.). The second annealing processing helps to improve an activity ratio of the dopant that diffuses to the source and the drain, that is, enables more dopants to be activated.

In some implementations, before the annealing processing is performed, forms of the foregoing manufacturing method may further include: forming a barrier layer on the diffused layer. For example, the material of the barrier layer may be silicon nitride, and the like. The barrier layer may prevent as much as possible the dopant in the diffused layer from diffusing outwards into the air or into a gap. Usually, the diffused layer contains an element of the dopant (for example, phosphorus or boron), and in addition, may be doped with other elements in a manufacturing process, for example, a hydrogen element. In the foregoing annealing processing process, a phosphorus element may be combined with the hydrogen element to form a phosphine ($PH_3$) gas, or a boron element may be combined with the hydrogen element to form a borane ($B_2H_6$) gas. When the foregoing barrier layer does not exist, these gases may diffuse towards into the air or into the gap. As a result, the doping density is reduced. Moreover, in a subsequent manufacturing process, other device structures may be polluted, so as to affect performance of a device. Therefore, the foregoing barrier layer may prevent the dopant in the diffused layer from diffusing outwards into the air or into the gap, avoiding affecting the performance of the device.

In some implementations, the foregoing manufacturing method may further include: forming, on the barrier layer, an interlayer dielectric layer covering the source and the drain. The barrier layer may further prevent the dopant in the diffused layer from diffusing into the interlayer dielectric layer. In some implementations, the foregoing manufacturing method may further include: forming a source contact and a drain contact that pass through the interlayer dielectric layer. The source contact is connected to the source, and the drain contact is connected to the drain. In the foregoing step, the doping densities at the surfaces of the source and the drain are increased because the dopant in the diffused layer diffuses to the surfaces of the source and the drain. Therefore, contact resistances between the source and the drain and corresponding contacts may be reduced.

FIG. 2A to FIG. 2H are sectional diagrams that schematically illustrate structures at multiple phases of a manufacturing process of a semiconductor device. A manufacturing process of a semiconductor device according to some implementations of the present disclosure is described below in detail with reference to FIG. 2A to FIG. 2H.

First, as shown in 2A, a substrate 20 is provided. The substrate 20 may include: a semiconductor layer (for example, silicon) 201 and a semiconductor fin (for example, silicon) 202 on the semiconductor layer 201. Optionally, the substrate 20 may further include a trench isolation portion 203 that is on the semiconductor layer 201 and that is around the semiconductor fin 202. The trench isolation portion 203 may be a Shallow Trench Isolation (STI). Optionally, the substrate 20 may further include an insulator layer (for example, silicon dioxide) 205 on a surface of the semiconductor fin 202. Optionally, the substrate 20 may further include a mask isolation layer 204 that is on a surface of the insulator layer 205 and that is on the trench isolation portion 203. The mask isolation layer 204 covers the semiconductor fin 202. For example, the mask isolation layer may be formed through a deposition process. The material of the mask isolation layer 204 may include a silicon nitride, and the like.

Subsequently, a source and a drain that are at least partially located in the substrate are formed. This step may be described with reference to FIG. 2B and FIG. 2C.

Figure 2A:
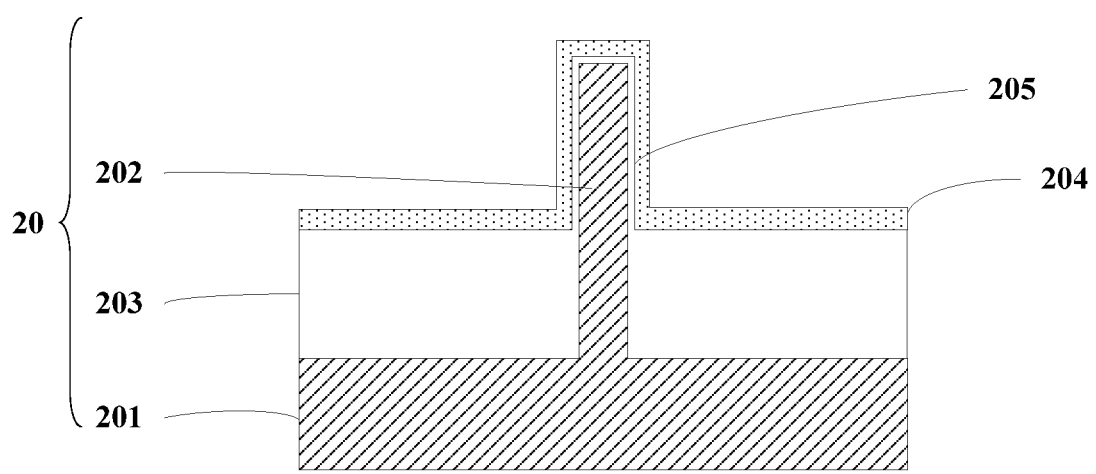
FIG. 2A to FIG. 2H are sectional diagrams that schematically illustrate structures at multiple phases of a manufacturing process of a semiconductor device.
Figure 2B:
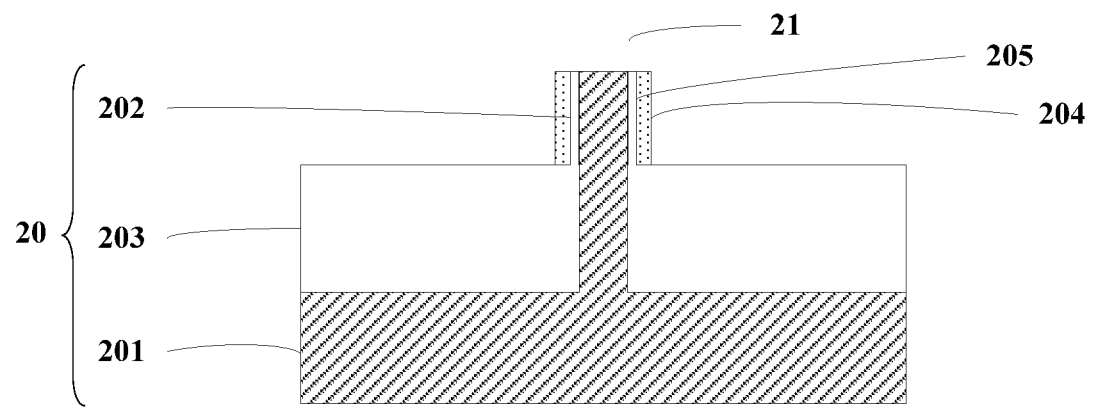

For example, as shown in FIG. 2B, an etching (for example, a dry etching) is performed on the semiconductor fin 202 to form a recess 21. The etching process may further remove a portion of the mask isolation layer 204, for example, remove a portion of the mask isolation layer 204 that is on the semiconductor fin 202 and a portion of the mask isolation layer 204 that is on a surface of the trench isolation portion 203. In addition, the etching process may further remove a portion of the insulator layer 205 that is on a surface of the semiconductor fin 202.

Figure 2C:
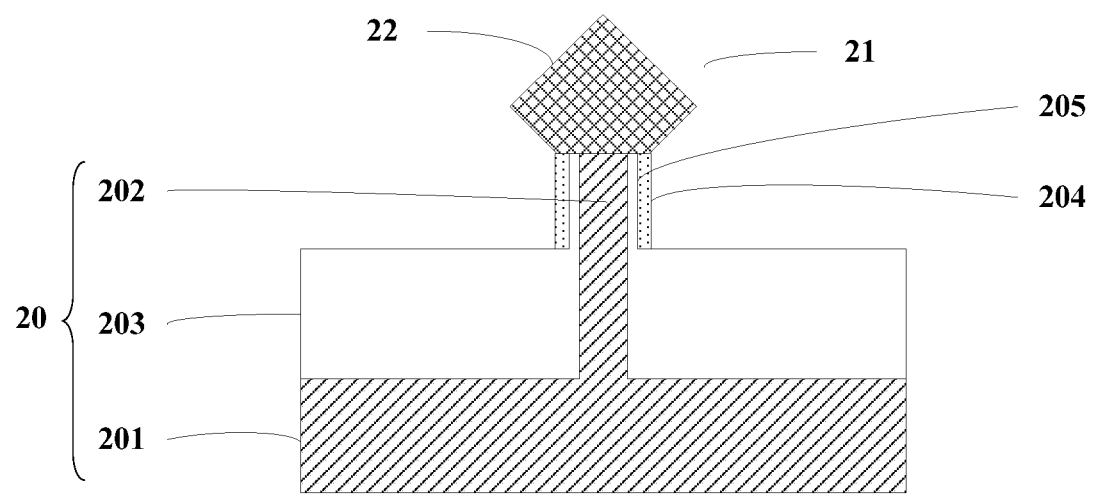

Subsequently, as shown in FIG. 2C, a source/drain 22 is formed in the recess 21 through, for example, an epitaxial process. Optionally, before the source and the drain are formed, the method may further include: pre-cleaning a structure shown in FIG. 2B, so as to eliminate an oxide of silicon at a surface of the structure. It should be noted that although the accompanying drawings show one of the source and the drain, a person skilled in the art may understand that the other one of the source and the drain is further formed in a manufacturing process of the present disclosure, but it is not shown in the figures. It should also be noted that a term "source/drain 22" indicates that a structure represented by a mark 22 may be a source, or may be a drain, and it is similar in the following.

In some implementations, in a process of epitaxially growing the source and the drain, the source and the drain may further be in-situ doped. For example, for a source and a drain of a PMOS device, an in-situ doped impurity is a P-typed dopant, for example, boron; and for a source and a drain of an NMOS device, an in-situ doped impurity is an N-typed dopant, for example, phosphorus. In some implementations, doping densities of the dopants in the source and the drain may be from $1\times10^{20}$ atom/cm$^3$ to $3\times10^{21}$ atom/cm$^3$ (for example, $5\times10^{20}$ atom/cm$^3$, $1\times10^{21}$ atom/cm$^3$, or $2\times10^{21}$ atom/cm$^3$).

In some implementations, the materials of the source and the drain may include silicon germanium (SiGe) or silicon phosphide (SiP). For example, for the PMOS device, the source and the drain may use SiGe. Further for example, for the NMOS device, the source and the drain may use SiP.

Figure 2D:
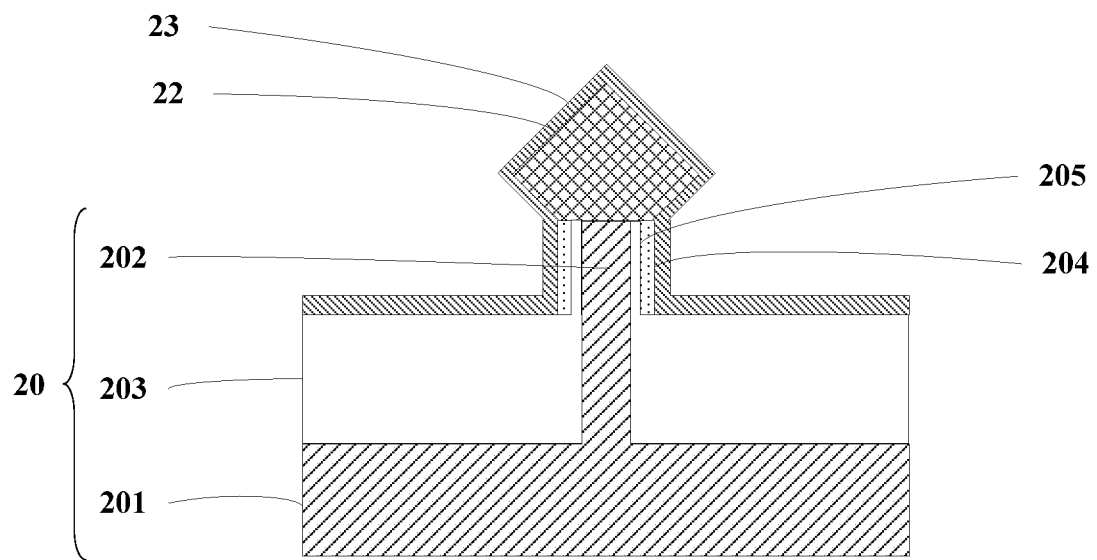

Subsequently, as shown in FIG. 2D, a diffused layer 23 is formed on the surfaces of the source and the drain through, for example, the deposition process. A conductivity type of the diffused layer 23 is the same as the conductivity types of the source and the drain. A doping density of a dopant contained in the diffused layer 23 is separately greater than doping densities of dopants contained in the source and the drain. For example, the thickness of the diffused layer 23 may be from 5 nm to 20 nm (for example, 10 nm).

In some implementations, the conductivity types of the source and the drain may be P-typed, and the diffused layer 23 may contain a P-typed dopant. For example, a doping density of the P-typed dopant contained in the diffused layer 23 may be from $1\times10^{20}$ atom/cm$^3$ to $3\times10^{22}$ atom/cm$^3$ (for example, $1\times10^{22}$ atom/cm$^3$). For example, the material of the diffused layer 23 may include a boron-doped silicon dioxide.

In other implementations, the conductivity types of the source and the drain may be N-typed, and the diffused layer 23 may contain an N-typed dopant. For example, a doping density of the N-typed dopant contained in the diffused layer 23 may be from $1\times10^{20}$ atom/cm$^3$ to $3\times10^{22}$ atom/cm$^3$ (for example, $1\times10^{22}$ atom/cm$^3$). For example, the material of the diffused layer 23 may include a phosphorus-doped silicon dioxide.

Figure 2E:
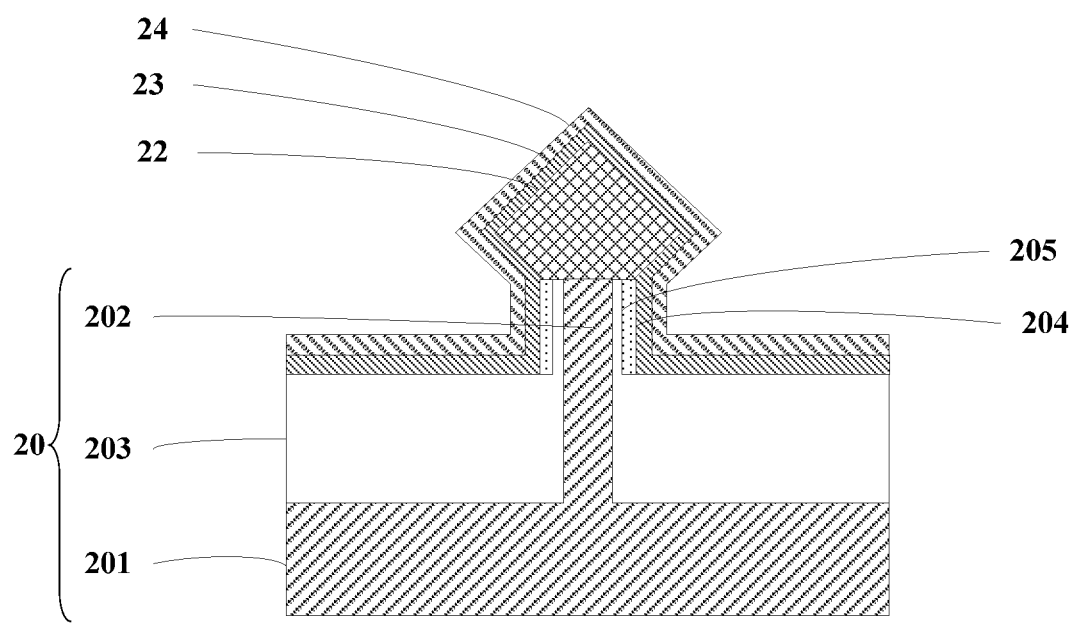

Subsequently, as shown in FIG. 2E, a barrier layer 24 is formed on the diffused layer 23 through, for example, the deposition process. For example, the material of the barrier layer 24 may include: silicon nitride (SiN), silicon oxynitride (SiON), silicon carbide (SiC), silicon boron oxide (SiBO), silicon oxycarbide (SiOC), silicon boron nitride (SiBN), or silicon boron oxynitride (SiBNO), and the like. In some implementations, the diffused layer 23 contains a P-typed dopant (for example, boron), and the thickness of the barrier layer 24 may be from 3 nm to 10 nm (for example, 5 nm or 8 nm). In other implementations, the diffused layer 23 contains an N-typed dopant (for example, phosphorus), and the thickness of the barrier layer 24 may be from 30 Å to 120 Å (for example, 50 Å, 80 Å, or 100 Å).

Figure 2F:
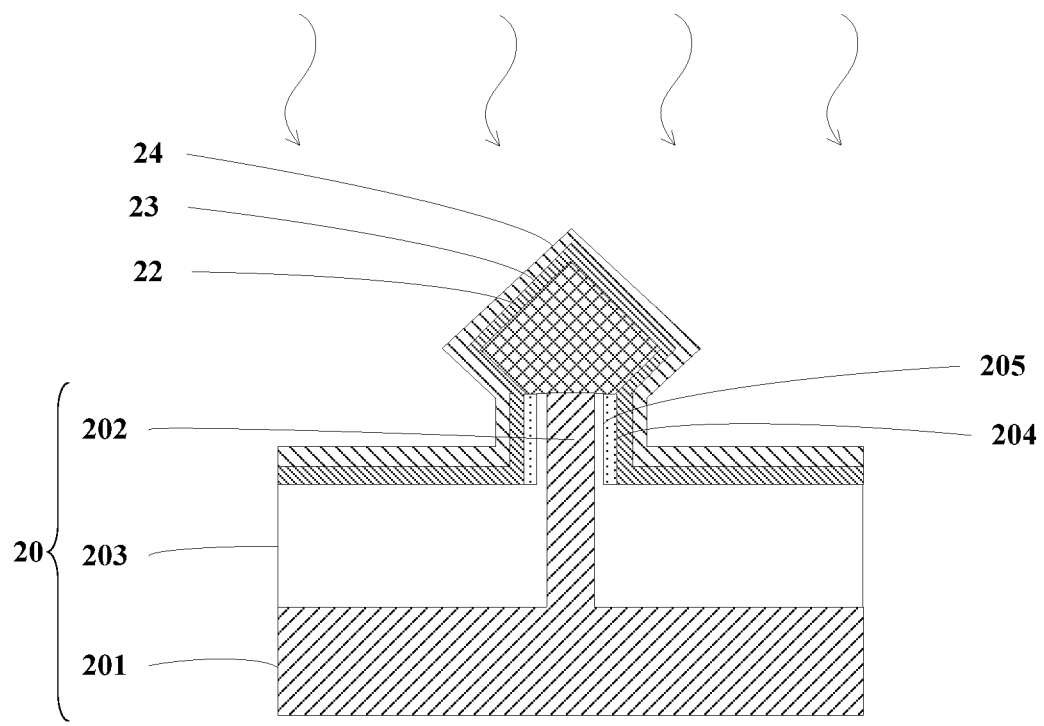

Subsequently, as shown in FIG. 2F, an annealing processing is performed on the structure shown in FIG. 2E. The annealing processing may include a first annealing processing and a second annealing processing. The first annealing processing may be a spike annealing. For example, an annealing temperature of the spike annealing may be from 900° C. to 1050° C. (for example, 1000° C.). The first annealing processing helps to enable the dopant in the diffused layer 23 to diffuse towards a surface of the source/drain 22, so as to increase the doping density at the surface of the source/drain 22. In addition, the first annealing processing may further help to activate the dopant that diffuses to the source/drain 22. The second annealing processing may be a laser annealing. For example, an annealing temperature of the laser annealing may be from 1100° C. to 1300° C. (for example, 1200° C.). The second annealing processing helps to improve an activity ratio of the dopant that diffuses to the source/drain 22, that is, enables more dopants to be activated.

Figure 2G:
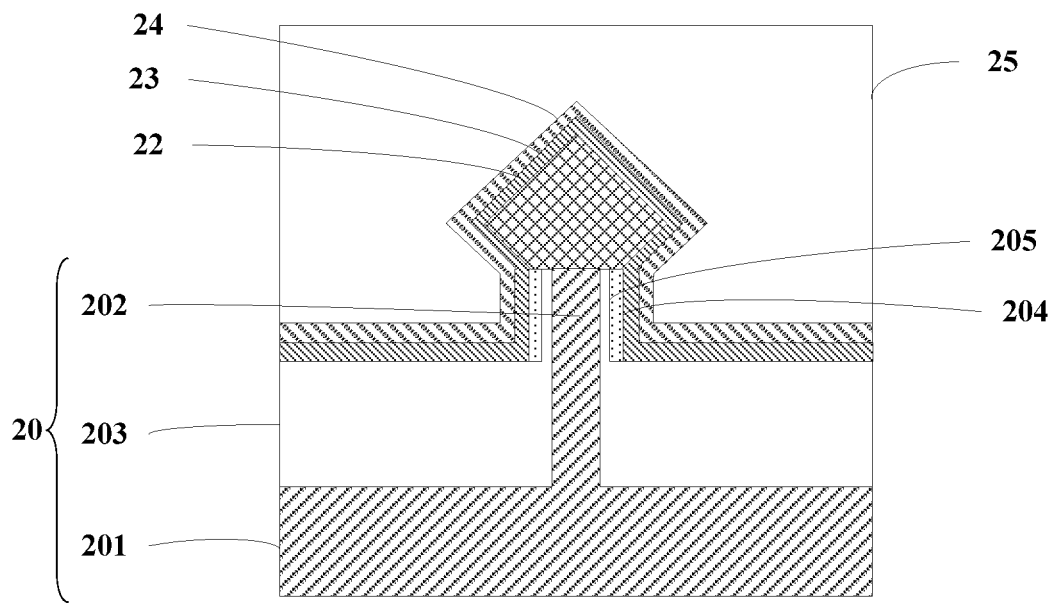

Subsequently, as shown in FIG. 2G, an interlayer dielectric layer (for example, silicon dioxide) 25 covering the source/drain 22 is formed on the barrier layer 24 through, for example, the deposition process.

Figure 2H:
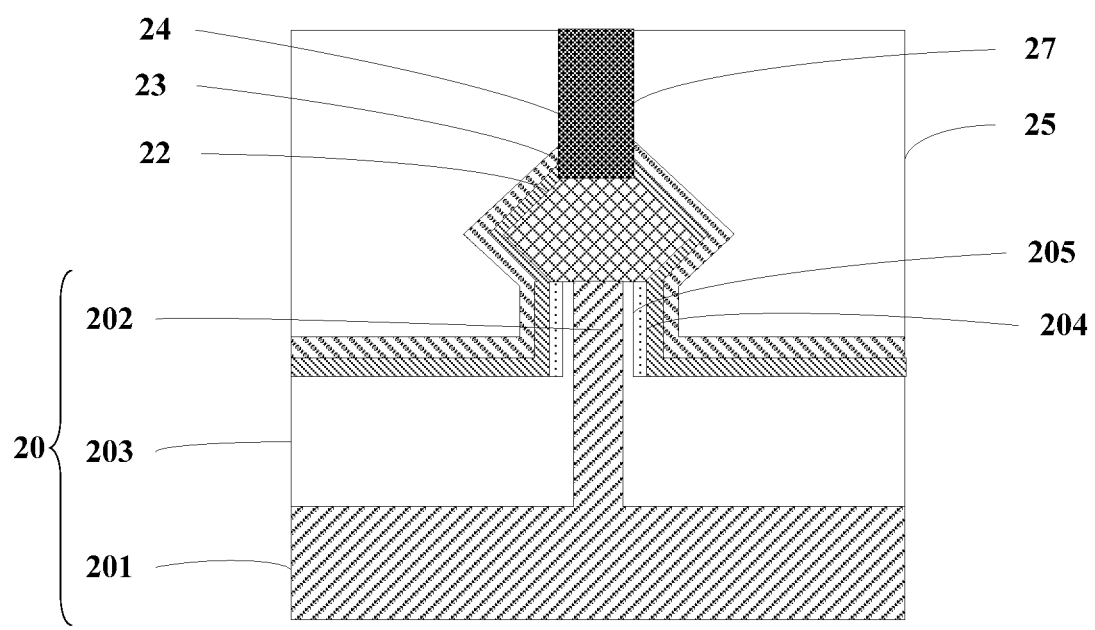

Subsequently, as shown in FIG. 2H, a source contact/drain contact 27 that passes through the interlayer dielectric layer 25 is formed. The source contact/drain contact 27 also passes through the barrier layer 24 and the diffused layer 23. The source contact is connected to the source, and the drain contact is connected to the drain. For example, the interlayer dielectric layer 25, the barrier layer 24, and the diffused layer 23 may be etched, so as to form an opening that exposes the source/drain 22, and then the source contact/drain contact 27 connected to the source/drain 22 is formed in the opening. It should be noted that a term "source contact/drain contact 27" indicates that a structure represented by a mark 27 may be a source contact, or may be a drain contact, and it is similar in the following. The materials of the source contact and the drain contact may include metals such as tungsten.

Heretofore, a method for manufacturing a semiconductor device according to some implementations of the present disclosure is provided. In implementations of the foregoing manufacturing methods, a diffused layer is formed on surfaces of a formed source and drain, a barrier layer is formed on the diffused layer, and then an annealing processing is performed. As a result, a dopant in the diffused layer diffuses towards the surfaces of the source and the drain, so as to increase doping densities at the surfaces of the source and the drain. In a process of manufacturing a source contact and a drain contact, a contact resistance between the source contact and the source and a contact resistance between the drain contact and the drain are facilitated to be reduced, thereby improving performance of a device.

In addition, in implementations of the foregoing manufacturing method, surface doping for the source and the drain is achieved by diffusion, and is not achieved through an ion injection as in the prior art. Therefore, implementations of the foregoing method in the present disclosure can reduce damage caused by the ion injection to the source and the drain, thereby improving performance of a device.

In implementations of the foregoing manufacturing method, a semiconductor device is further formed. For example, as shown in FIG. 2H, the semiconductor device may include: the substrate 20, the source and the drain that are at least partially located in the substrate 20 (for example, the source/drain 22 shown in FIG. 2H), and the diffused layer 23 on the surface of at least one of the source and the drain (for example, the source and the drain). The conductivity type of the diffused layer 23 is the same conductivity type as the source and the drain, and the doping density of the dopant contained in the diffused layer is separately greater than the doping densities of the dopants contained in the source and the drain.

In some implementations, the conductivity type of the source and the drain is N-typed, and the material of the diffused layer 23 may include the phosphorus-doped silicon dioxide. In other implementations, the conductivity type of the source and the drain is P-typed, and the material of the diffused layer 23 may include the boron-doped silicon dioxide.

In some implementations, as shown in FIG. 2H, the semiconductor device may further include the barrier layer 24 on the diffused layer 23.

In some implementations, as shown in FIG. 2H, the semiconductor device may further include the interlayer dielectric layer 25 that is formed on the barrier layer 24 and that covers the source and the drain.

In some implementations, as shown in FIG. 2H, the semiconductor device may further include the source contact and the drain contact (for example, the source contact/drain contact 27 shown in FIG. 2H) that pass through the interlayer dielectric layer 25. The source contact is connected to the source, and the drain contact is connected to the drain.

In some implementations, as shown in FIG. 2H, the substrate 20 may include: the semiconductor layer 201 and the semiconductor fin 202 on the semiconductor layer 201. The source and the drain are at least partially located in the semiconductor fin 202, separately. Optionally, the substrate 20 may further include the trench isolation portion 203 that is on the semiconductor layer 201 and that is around the semiconductor fin 202. Optionally, the substrate 20 may further include the insulator layer (for example, silicon dioxide) 205 on the surface of the semiconductor fin 202. Optionally, the substrate 20 may further include the mask isolation layer 204 that is on the surface of the insulator layer 205.

In implementations of the foregoing semiconductor device, the dopant in the diffused layer may diffuse to surfaces of the source and/or the drain, so as to increase doping densities of the source and/or the drain. Therefore, a contact resistance between the source contact and the source and/or a contact resistance between the drain contact and the drain may be reduced, thereby improving performance of a device.

Figure 3:
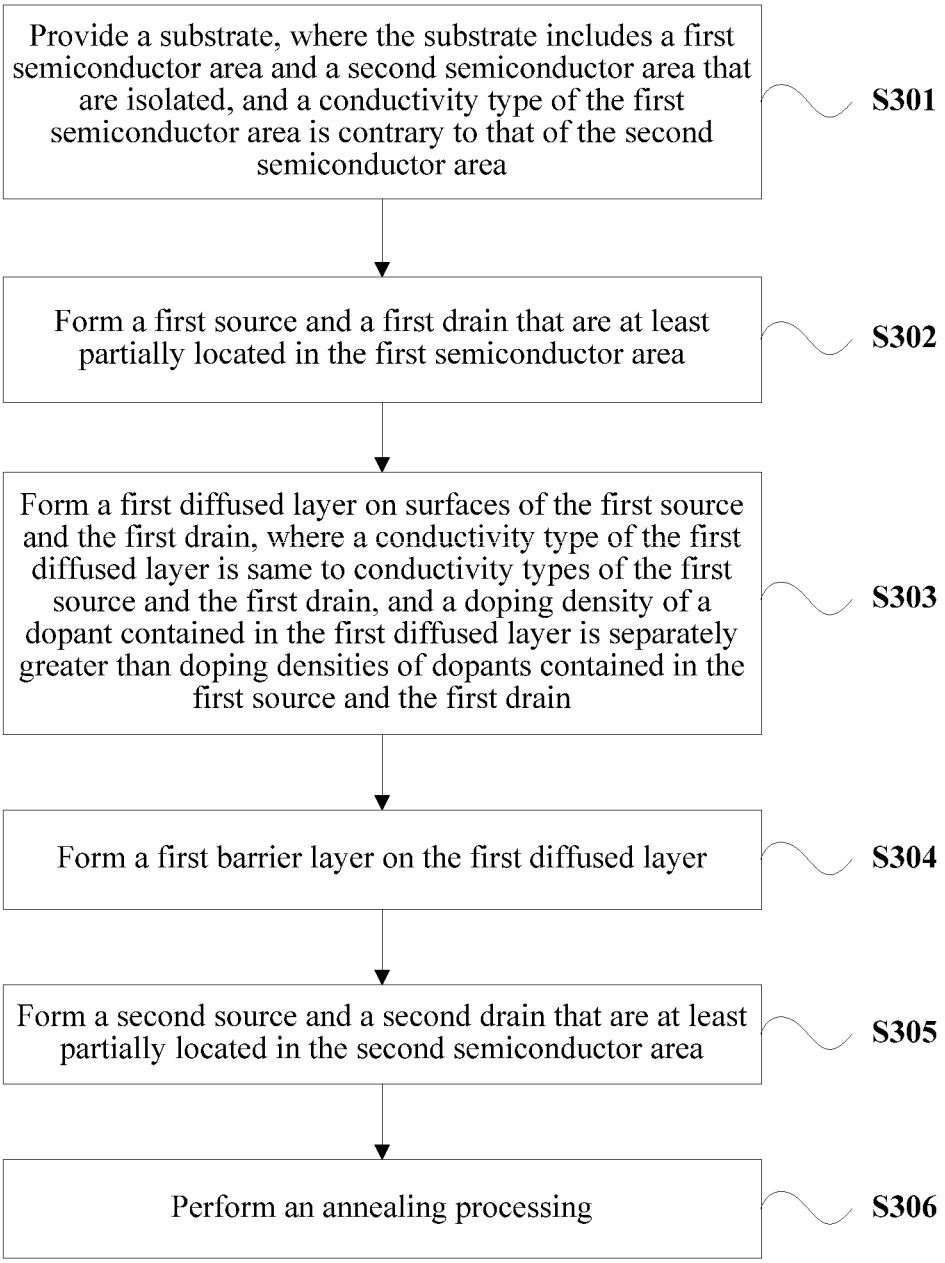
FIG. 3 is a flowchart of another method for manufacturing a semiconductor device.

FIG. 3 is a flowchart of another method for manufacturing a semiconductor device.

In step S301: Provide a substrate, where the substrate includes a first semiconductor area and a second semiconductor area that are isolated, and a conductivity type of the first semiconductor area is contrary to that of the second semiconductor area. For example, in step S301, the first semiconductor area may be a first semiconductor fin, and the second semiconductor area may be a second semiconductor fin. Optionally, the substrate may further include a semiconductor layer, where both the first semiconductor fin and the second semiconductor fin are on the semiconductor layer. In other implementations, the substrate may be a substrate that is configured to form a planar device, and the first semiconductor area and the second semiconductor area respectively are two isolated areas in this substrate.

In some implementations, a conductivity type of the first semiconductor area may be P-typed, and a conductivity type of the second semiconductor area may be N-typed. Alternatively, the conductivity type of the first semiconductor area may be N-typed, and a conductivity type of the second semiconductor area may be P-typed.

In step S302: Form a first source and a first drain that are at least partially located in the first semiconductor area. For example, in step S302, the first source and the first drain may be at least partially formed in the first semiconductor fin, separately.

In step S303: Form a first diffused layer on surfaces of the first source and the first drain, where a conductivity type of the first diffused layer is the same conductivity type as the first source and the first drain, and a doping density of a dopant contained in the first diffused layer is separately greater than doping densities of dopants contained in the first source and the first drain.

In step S304: Form a first barrier layer on the first diffused layer.

In step S305: Form a second source and a second drain that are at least partially located in the second semiconductor area. For example, in step S305, the second source and the second drain may be at least partially formed in the second semiconductor fin, separately.

In step S306: Perform an annealing processing.

In implementations of the manufacturing method described above, sources and drains of two different semiconductor devices are formed. A first source and a first drain are formed in a first semiconductor area, and a second source and a second drain are formed in a second semiconductor area. Moreover, a first diffused layer is formed on surfaces of the first source and the first drain, a first barrier layer is formed on the first diffused layer, and subsequently, an annealing processing is performed. Therefore, a dopant in the first diffused layer diffuses towards the surfaces of the first source and the first drain, so as to increase doping densities at the surfaces of the first source and the first drain. When a first source contact and a first drain contact are subsequently formed, a contact resistance between the first source contact and the first source and a contact resistance between the first drain contact and the first drain are facilitated to be reduced, thereby improving performance of a device.

In addition, in implementations of the foregoing manufacturing method, surface doping for the first source and the first drain is achieved by diffusion, and is not achieved through an ion injection as in the prior art. Therefore, implementations of the foregoing method in the present disclosure can reduce damage caused by the ion injection to the first source and the first drain, thereby improving performance of a device.

In some implementations, before the annealing processing is performed, the foregoing manufacturing method may further include: forming a second diffused layer on surfaces of the second source and the second drain. A conductivity type of the second diffused layer is the same as the conductivity types of the second source and the second drain. A doping density of a dopant contained in the second diffused layer is separately greater than doping densities of dopants contained in the second source and the second drain. That is, a doping density of the second diffused layer is greater than a doping density of the second source, and the doping density of the second diffused layer is greater than a doping density of the second drain. Optionally, the foregoing manufacturing method may further include: forming a second barrier layer on the second diffused layer.

In some implementations, the second diffused layer is formed on surfaces of the second source and the second drain, the second barrier layer is formed on the second diffused layer, and subsequently, the annealing processing is performed. Therefore, the dopant in the second diffused layer diffuses towards the surfaces of the second source and the second drain, so as to increase doping densities at the surfaces of the second source and the second drain. When a second source contact and a second drain contact are subsequently formed, a contact resistance between the second source contact and the second source and a contact resistance between the second drain contact and the second drain are facilitated to be reduced, thereby improving performance of a device.

In some implementations, the conductivity types of the first source and the first drain may be P-typed, and the first diffused layer may include a P-typed dopant (for example, boron). For example, the material of first diffused layer may include a boron-doped silicon dioxide. In some implementations, the conductivity types of the second source and the second drain may be N-typed, and the second diffused layer may include an N-typed dopant (for example, phosphorus). For example, the material of second diffused layer may include a phosphorus-doped silicon dioxide.

In some implementations, the annealing processing may include a first annealing processing. For example, the first annealing processing may be a spike annealing. For example, an annealing temperature of the spike annealing may be from 900° C. to 1050° C. (for example, 1000° C.). The first annealing processing helps to enable the dopant in the first diffused layer to diffuse towards the surfaces of the first source and the first drain, and to enable the dopant in the second diffused layer to diffuse towards the surfaces of the second source and the second drain, so as to increase doping densities at the surfaces of the first source, the first drain, the second source, and the second drain, and reduce contact resistances. In addition, the first annealing processing may further help to activate the dopants that diffuse to the source (for example, the first source and the second source) and the drain (for example, the first drain and the second drain).

Optionally, the annealing processing may further include a second annealing processing after the first annealing processing is performed. For example, the second annealing processing may be a laser annealing. For example, an annealing temperature of the laser annealing may be from 1100° C. to 1300° C. (for example, 1200° C.). The second annealing processing helps to improve an activity ratio of the dopants that diffuse to the source (for example, the first source and the second source) and the drain (for example, the first drain and the second drain), that is, enables more dopants to be activated.

In some implementations, in the step of forming the second diffused layer, the second diffused layer may further be formed on the first barrier layer above the first source and the first drain.

In some implementations, the foregoing manufacturing method may further include: forming, on the second barrier layer, an interlayer dielectric layer covering the first source, the first drain, the second source, and the second drain.

In some implementations, the foregoing manufacturing method may further include: forming a first source contact, a first drain contact, a second source contact, and a second drain contact that pass through the interlayer dielectric layer. The first source contact is connected to the first source, the first drain contact is connected to the first drain, the second source contact is connected to the second source, and the second drain contact is connected to the second drain. In the foregoing steps, the dopant in the first diffused layer diffuses towards the surfaces of the first source and the first drain, and the dopant in the second diffused layer diffuses towards the surfaces of the second source and the second drain. Therefore, doping densities at the surfaces of the first source, the first drain, the second source, and the second drain are increased, and contact resistances between these contacts and corresponding sources or drains are reduced, thereby improving performance of a device.

FIG. 4A to FIG. 4L are sectional diagrams that schematically illustrate structures at multiple phases of a manufacturing process of a semiconductor device. Implementations of a manufacturing process of a semiconductor device are described below in detail with reference to FIG. 4A to FIG. 4L.

Figure 4A:
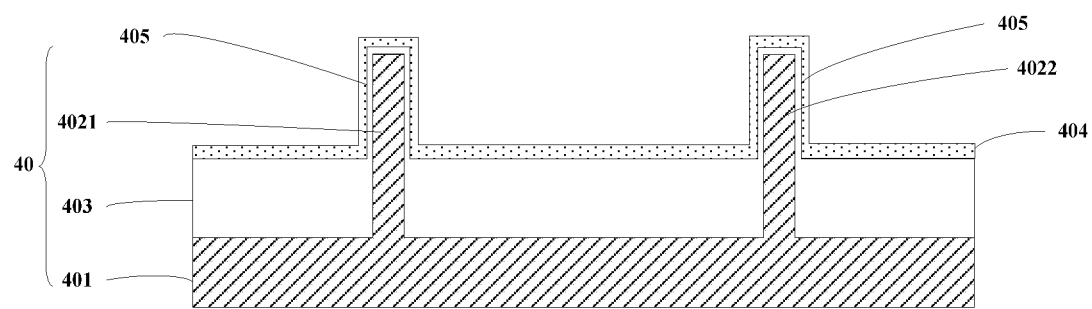
FIG. 4A to FIG. 4L are sectional diagrams that schematically illustrate structures at multiple phases of a manufacturing process of a semiconductor device.

First, as shown in FIG. 4A, a substrate 40 is provided. The substrate 40 may include: a semiconductor layer 401, and a first semiconductor fin 4021 and a second semiconductor fin 4022 that are on the semiconductor layer 401 and that are isolated. Optionally, the substrate 40 may further include a trench isolation portion 403 that is on the semiconductor layer 401 and that is around the first semiconductor fin 4021 and the second semiconductor fin 4022. Optionally, the substrate 40 may further include an insulator layer (for example, silicon dioxide) 405 on surfaces of the first semiconductor fin 4021 and the second semiconductor fin 4022. Optionally, the substrate 40 may further include a mask isolation layer 404 that is on a surface of the insulator layer 405 and that is on the trench isolation portion 403. The mask isolation layer 404 covers the first semiconductor fin 4021 and the second semiconductor fin 4022. The material of the mask isolation layer 404 may include a silicon nitride, and the like.

For example, a conductivity type of the first semiconductor fin 4021 is N-typed, that is, the first semiconductor fin may be configured to form a PMOS device; and a conductivity type of the second semiconductor fin 4022 is P-typed, that is, the second semiconductor fin may be configured to form an NMOS device.

Subsequently, a first source and a first drain that are at least partially located in the first semiconductor fin are formed. A process of forming the first source and the first drain may be described with reference to FIG. 4B and FIG. 4C.

Figure 4B:
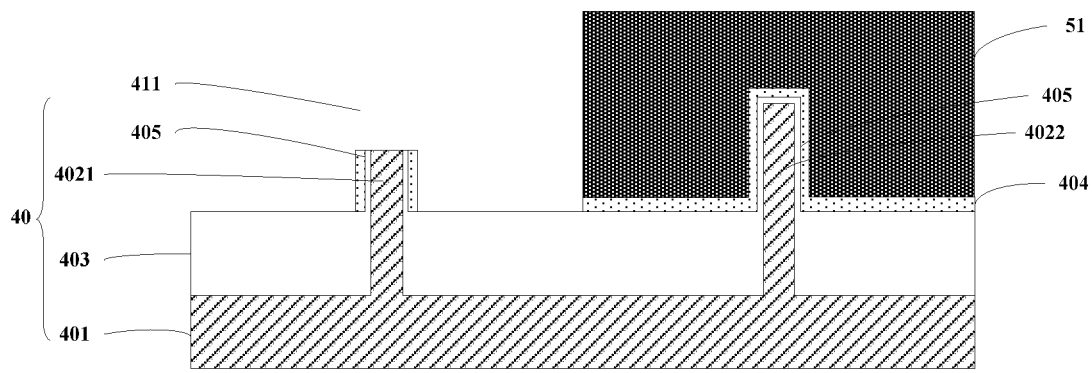

For example, as shown in FIG. 4B, a patterned first mask layer (for example photoresist) 51 is formed on the mask isolation layer 404. The first mask layer 51 covers the second semiconductor fin 4022 and covers a portion of the trench isolation portion around the second semiconductor fin 4022, so as to expose a portion of the mask isolation layer that is on the first semiconductor fin 4021 and expose a portion of the mask isolation layer that is on a portion of the trench isolation portion that is around the first semiconductor fin 4021. Subsequently, the first mask layer 51, as a mask, performs an etching (for example, a dry etching) on the first semiconductor fin 4021, so as to form a first recess 411. The etching process further removes a portion of the mask isolation layer 404 and a portion of the insulator layer 405, as shown in FIG. 4B. Subsequently, the first mask layer 51 is removed.

Figure 4C:
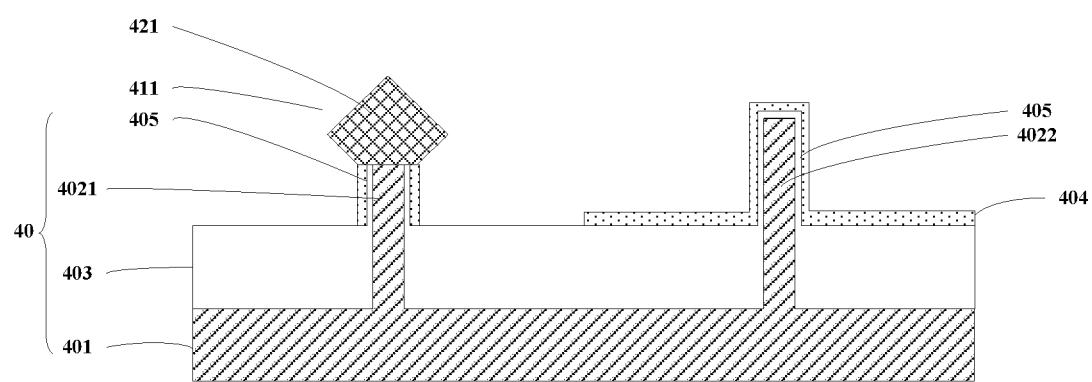

Subsequently, as shown in FIG. 4C, a first source/first drain (for example, SiGe) 421 is formed in the first recess 411 through, for example, an epitaxial process. Optionally, before the first source and the first drain are formed, the method may further include: pre-cleaning a semiconductor structure after the first recess is formed, so as to eliminate an oxide of silicon at a surface of the structure. It should be noted that although the accompanying drawings show one of the first source and the first drain, a person skilled in the art may understand that the other one of the first source and the first drain is further formed in a manufacturing process of the present disclosure, but it is not shown in the figures. It should also be noted that a term "first source/first drain 421" indicates that a structure represented by a mark 421 may be a first source, or may be a first drain, and it is similar in the following.

In some implementations, in a process of epitaxially growing the first source and the first drain, the first source and the first drain may further be in-situ doped. In some implementations, an in-situ doped impurity may be a P-typed dopant, for example, boron. For example, a doping density of the P-typed dopant may be from $1\times10^{20}$ atom/cm$^3$ to $3\times10^{21}$ atom/cm$^3$ (for example, $5\times10^{20}$ atom/cm$^3$, $1\times10^{21}$ atom/cm$^3$, or $2\times10^{21}$ atom/cm$^3$).

Figure 4D:
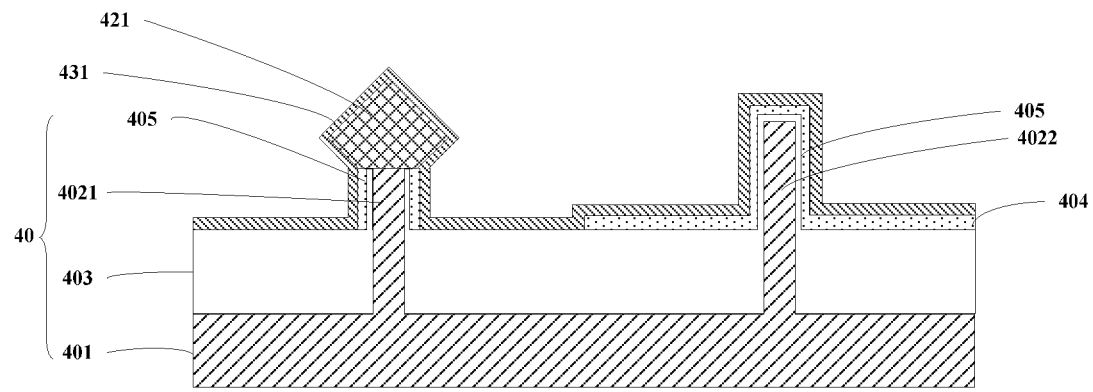

Subsequently, as shown in FIG. 4D, a diffused layer 431 is formed on surfaces of the first source and the first drain through, for example, a deposition process. For example, conductivity types of the first source and the first drain may be P-typed, and the first diffused layer 431 may include the P-typed dopant (for example, boron). For example, the doping density of the P-typed dopant contained in the first diffused layer 431 may be from $1\times10^{20}$ atom/cm$^3$ to $3\times10^{22}$ atom/cm$^3$ (for example, $1\times10^{22}$ atom/cm$^3$). For example, the material of first diffused layer 431 may include a boron-doped silicon dioxide. For example, the thickness of the first diffused layer 431 may be from 5 nm to 20 nm (for example, 10 nm). The first diffused layer 431 is further formed on a portion of the mask isolation layer 404 that is above the second semiconductor fin 4022.

Figure 4E:
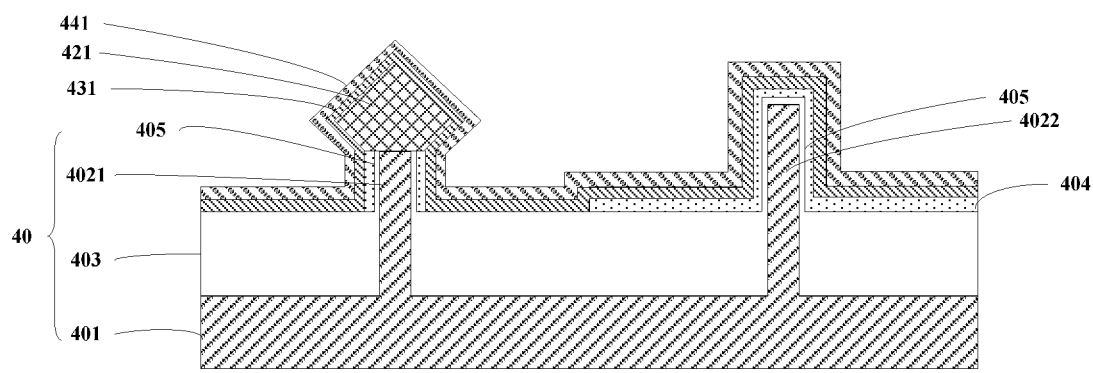

Subsequently, as shown in FIG. 4E, a first barrier layer 441 is formed on the first diffused layer 431 through, for example, the deposition process. For example, the material of the first barrier layer 441 may include a silicon nitride, and the like. In some implementations, the thickness of the first barrier layer 441 may be from 3 nm to 10 nm (for example, 5 nm or 8 nm).

Subsequently, a second source and a second drain that are at least partially located in the second semiconductor fin are formed. A process of forming the second source and the second drain may be described below in detail with reference to FIG. 4F and FIG. 4G.

Figure 4F:
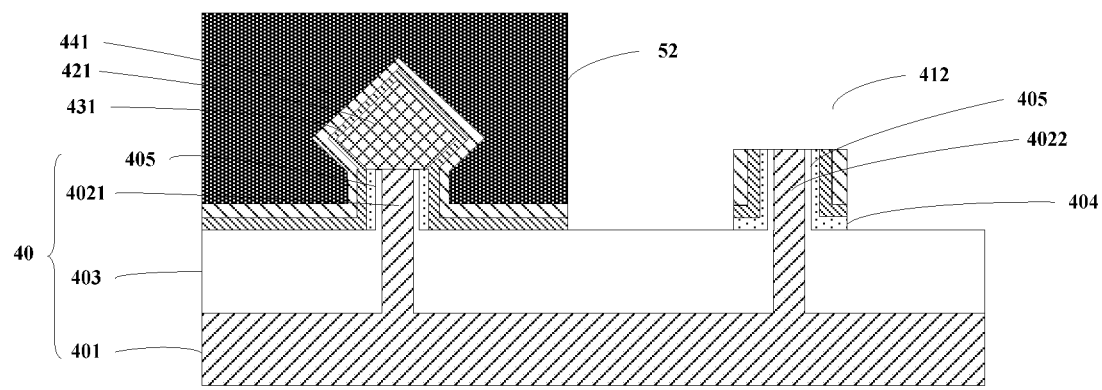

For example, as shown in FIG. 4F, a patterned second mask layer (for example photoresist) 52 is formed on the first barrier layer 441. The second mask layer 52 covers the first source/first drain 421, the first semiconductor fin 4021, and a portion of the trench isolation portion around the first semiconductor fin 4021, so as to expose a portion of the first barrier layer that is on the second semiconductor fin 4022 and expose a portion of the first barrier layer that is on a portion of the trench isolation portion that is around the second semiconductor fin 4022. Subsequently, the second mask layer 52, as a mask, performs an etching (for example, a dry etching) on the second semiconductor fin 4022, so as to form a second recess 412. The etching process further removes a portion of the first barrier layer 441, a portion of the first diffused layer 431, a portion of the mask isolation layer 404, and a portion of the insulator layer 405, as shown in FIG. 4F. Subsequently, the second mask layer 52 is removed.

Figure 4G:
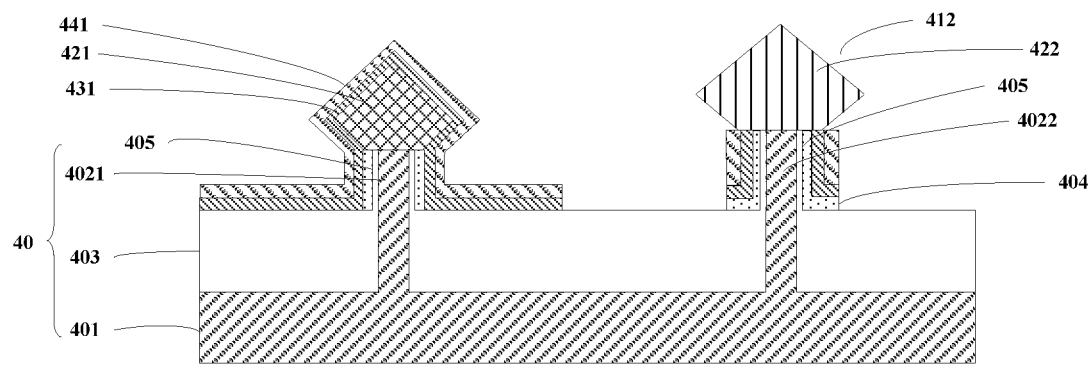

Subsequently, as shown in FIG. 4G, the second source/second drain (for example, SiP) 422 is formed in the second recess 412 through, for example, the epitaxial process. It should be noted that although the accompanying drawings show one of the second source and the second drain, a person skilled in the art may understand that the other one of the second source and the second drain is further formed in a manufacturing process of the present disclosure, but it is not shown in the figures. It should also be noted that a term "second source/second drain 422" indicates that a structure represented by a mark 422 may be a second source, or may be a second drain, and it is similar in the following.

In some implementations, in a process of epitaxially growing the second source and the second drain, the second source and the second drain may further be in-situ doped. In some implementations, an in-situ doped impurity may be an N-typed dopant, for example, phosphorus. For example, a doping density of the N-typed dopant may be from $1\times10^{20}$ atom/cm$^3$ to $3\times10^{21}$ atom/cm$^3$ (for example, $5\times10^{20}$ atom/cm$^3$, $1\times10^{21}$ atom/cm$^3$, or $2\times10^{21}$ atom/cm$^3$).

Figure 4H:
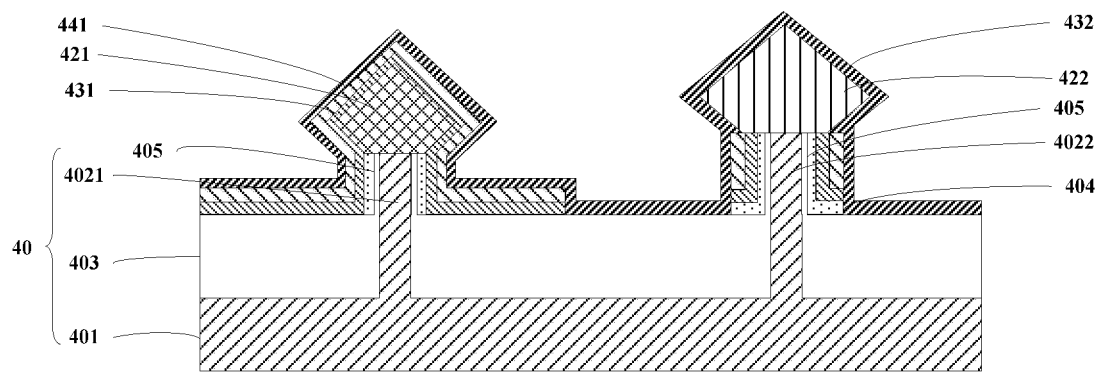

Subsequently, as shown in FIG. 4H, a second diffused layer 432 is formed on surfaces of the second source and the second drain through, for example, the deposition process. For example, conductivity types of the second source and the second drain may be N-typed, and the second diffused layer 432 may include the N-typed dopant (for example, phosphorus). For example, the doping density of the N-typed dopant contained in the second diffused layer 432 may be from $1\times10^{20}$ atom/cm$^3$ to $3\times10^{22}$ atom/cm$^3$ (for example, $1\times10^{22}$ atom/cm$^3$). For example, the material of second diffused layer 432 may include a phosphorus-doped silicon dioxide. For example, the thickness of the second diffused layer 432 may be from 5 nm to 20 nm (for example, 10 nm). In the step of forming the second diffused layer, as shown in FIG. 4H, the second diffused layer 432 may further be formed on the first barrier layer 441 above the first source and the first drain. The second diffused layer 432 may further be formed above the trench isolation portion 403.

Figure 4I:
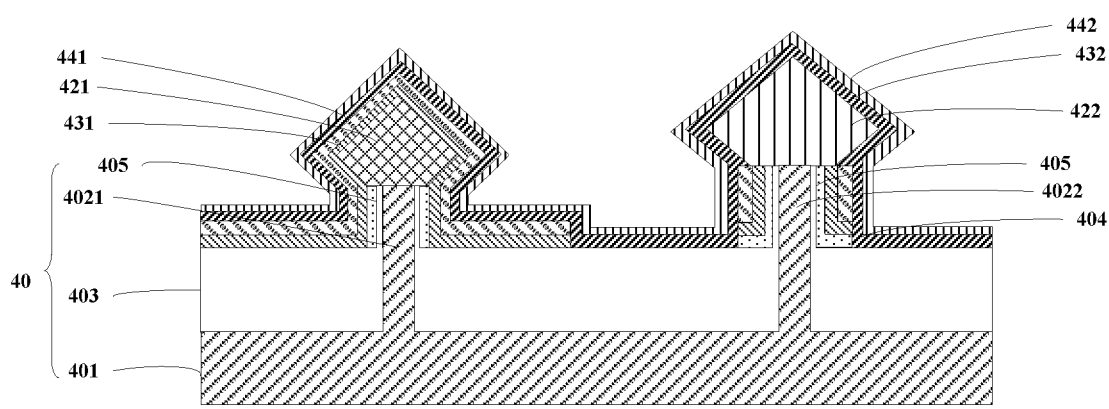

Subsequently, as shown in FIG. 4I, a second barrier layer 442 is formed on the second diffused layer 432 through, for example, the deposition process. For example, the second barrier layer 442 may be a contact etch stop layer (CESL). For example, the material of the second barrier layer 442 may include: SiN, SiON, SiC, SiBO, SiOC, SiBN, or SiBNO. In some implementations, the thickness of the second barrier layer 442 may be from 30 Å to 120 Å (for example, 50 Å, 80 Å, or 100 Å).

Figure 4J:
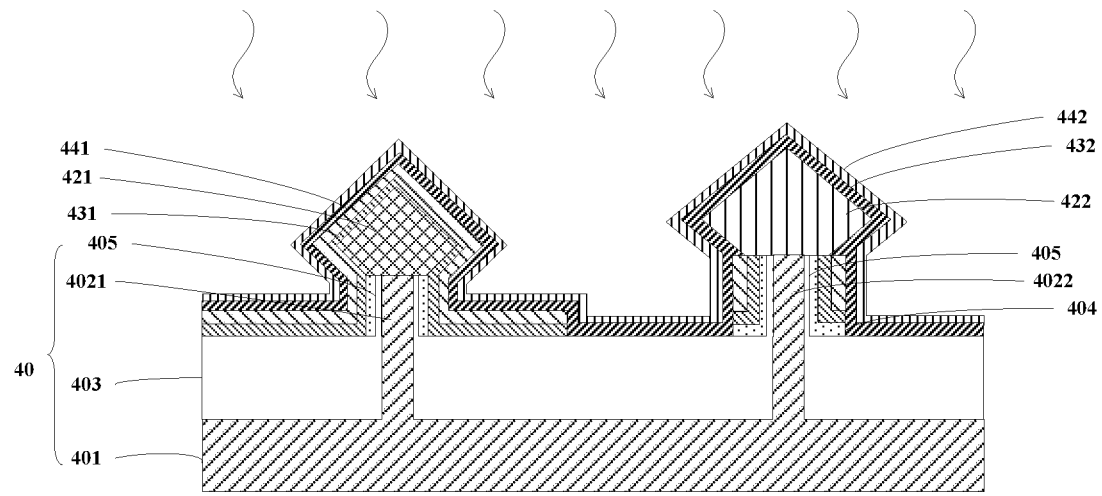

Subsequently, as shown in FIG. 4J, an annealing processing is performed on the structure shown in FIG. 4I. The annealing processing may include a first annealing processing and a second annealing processing. The first annealing processing may be a spike annealing. For example, an annealing temperature of the spike annealing may be from 900° C. to 1050° C. (for example, 1000° C.). The first annealing processing helps to enable the P-typed dopant in the first diffused layer 431 to diffuse towards the surface of the first source/first drain 421, and to enable the N-typed dopant in the second diffused layer 432 to diffuse towards the surface of the second source/second drain 422, so as to increase doping densities at the surfaces of the first source, the first drain, the second source, and the second drain, and reduce contact resistances. In addition, the first annealing processing may further help to activate the dopants that diffuse to the source (for example, the first source and the second source) and the drain (for example, the first drain and the second drain). The second annealing processing may be a laser annealing. For example, an annealing temperature of the laser annealing may be from 1100° C. to 1300° C. (for example, 1200° C.). The second annealing processing helps to improve an activity ratio of the dopants that diffuse to the source/drain.

It should be noted that in the foregoing diffusion process, the first barrier layer 441 may prevent as much as possible the P-typed dopant (for example, in a form of a formed impurity gas containing the P-typed dopant, for example, a boron hydride gas containing boron) in the first diffused layer 431 from diffusing outwards into the air or into a gap, and may further prevent the N-typed dopant in the second diffused layer 432 from diffusing inwards into the first source/first drain 421. This may avoid reducing performance of a device. The second barrier layer 442 may prevent as much as possible the N-typed dopant (for example, in a form of a formed impurity gas containing the N-typed dopant, for example, a phospholane gas containing phosphorus) in the second diffused layer 432 from diffusing outwards into the air or into a gap. This may avoid reducing performance of a device.

Figure 4K:
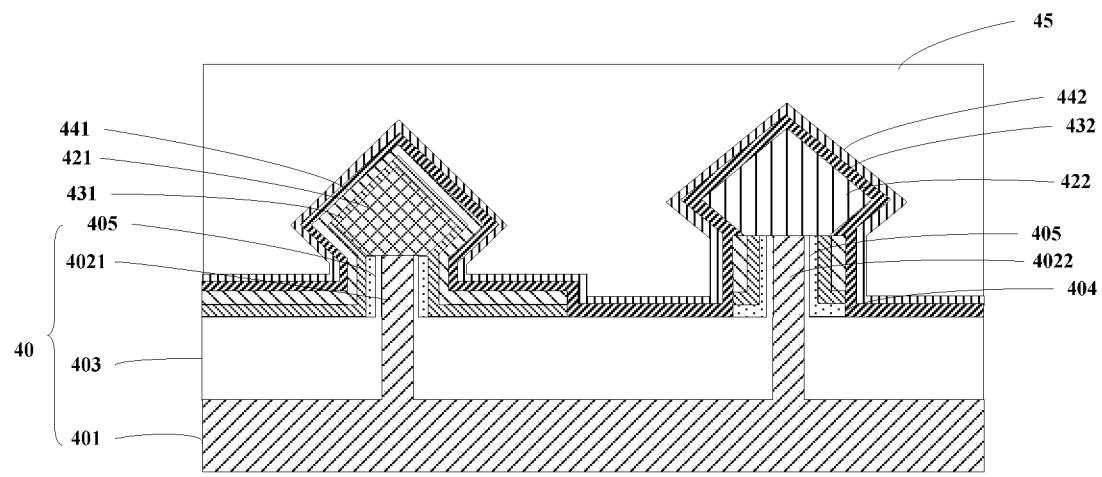

Subsequently, as shown in FIG. 4K, an interlayer dielectric layer (for example, silicon dioxide) 45 covering the first source/first drain 421 and the second source/second drain 422 is formed on the second barrier layer 442 through, for example, the deposition process.

Figure 4L:
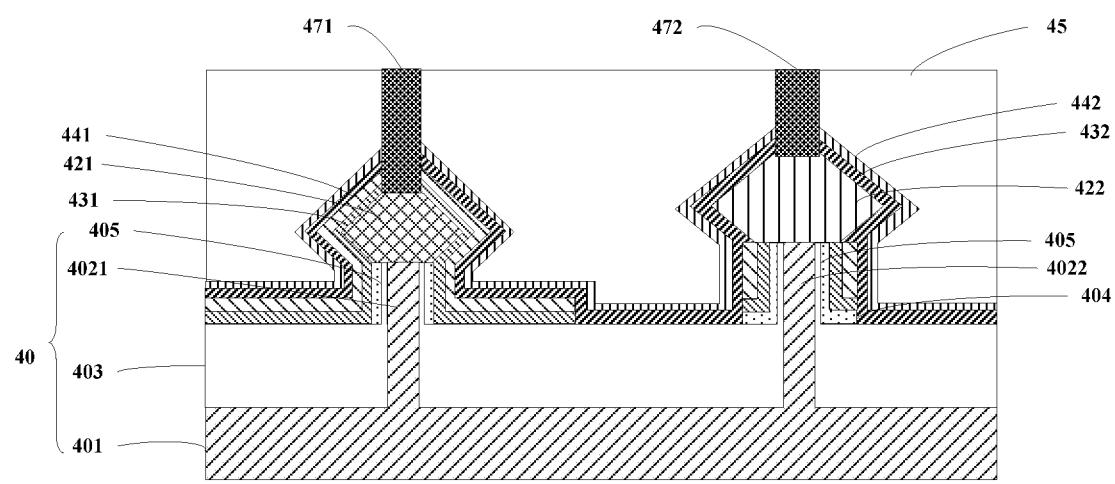

Subsequently, as shown in FIG. 4L, a first source contact/first drain contact 471 and a second source contact/second drain contact 472 that pass through the interlayer dielectric layer 45 are formed. The first source contact/first drain contact 471 further passes through the second barrier layer 442, the second diffused layer 432, the first barrier layer 441, and the first diffused layer 431. The first source contact is connected to the first source, and the first drain contact is connected to the first drain. The second source contact/second drain contact 472 further passes through the second barrier layer 442 and the second diffused layer 432. The second source contact is connected to the second source, and the second drain contact is connected to the second drain. For example, the interlayer dielectric layer 45, the second barrier layer 442, the second diffused layer 432, the first barrier layer 441, and the first diffused layer 431 may be etched, so as to form a first opening that exposes the first source/first drain 421 and a second opening that exposes the second source/second drain 422; and then the first source contact/first drain contact 471 connected to the first source/first drain 421 is formed in the first opening, and the second source contact/second drain contact 472 connected to the second source/second drain 422 is formed in the second opening.

It should be noted that a term "first source contact/first drain contact 471" indicates that a structure represented by a mark 471 may be a first source contact, or may be a first drain contact; and a term "second source contact/second drain contact 472" indicates that a structure represented by a mark 472 may be a second source contact, or may be a second drain contact, and it is similar in the following.

In implementations of the manufacturing method described above, a P-typed first source and first drain are formed at an N-typed first semiconductor fin, a P-typed first diffused layer is formed at the surfaces of the first source and the first drain, and the first barrier layer is formed on the first diffused layer. An N-typed second source and second drain are formed at a P-typed second semiconductor fin, an N-typed second diffused layer is formed on the surfaces of the second source and the second drain, and the second barrier layer is formed on the second diffused layer. Subsequently, an annealing processing is performed. As a result, the p-typed dopant in the first diffused layer diffuses towards the surfaces of the first source and the first drain, and the N-typed dopant in the second diffused layer diffuses towards the surfaces of the second source and the second drain. Therefore, doping densities at the surfaces of the first source, the first drain, the second source, and the second drain are increased, and contact resistances between the sources or the drains and corresponding contacts are reduced, thereby improving performance of a device.

In addition, in the foregoing manufacturing method, surface doping for each source and drain is achieved by diffusion, and is not achieved through an ion injection as in the prior art. Therefore, the foregoing method in the present disclosure can reduce damages caused by the ion injection to each source and drain, thereby improving performance of a device.

Further, compared with the prior art, the foregoing manufacturing method of the present disclosure may save the costs. In the prior art, when a high-density surface doping (for example, ion injection) is performed on sources and drains of a PMOS device and an NMOS device, one of the PMOS device and the NMOS device needs to be covered by using a corresponding mask, and then the other is doped. Therefore, two additional masks or photoetching processes are required; and this increases the costs. However, the foregoing manufacturing method of the present disclosure saves the two masks or photoetching processes, thereby simplifying the process, and reducing the costs.

In implementations of the foregoing manufacturing method described above, a semiconductor device is further formed. For example, as shown in FIG. 4L, the semiconductor device may include the substrate 40. The substrate 40 may include a first semiconductor area and a second semiconductor area that are isolated, and a conductivity type of the first semiconductor area is contrary to that of the second semiconductor area. For example, first semiconductor area may be the first semiconductor fin 4021, and the second semiconductor area may be the second semiconductor fin 4022. Optionally, the substrate 40 may further include the semiconductor layer 401, where both the first semiconductor fin 4021 and the second semiconductor fin 4022 are on the semiconductor layer 401. Optionally, the substrate 40 may further include the trench isolation portion 403 that is on the semiconductor layer 401 and that is around the first semiconductor fin 4021 and the second semiconductor fin 4022. Optionally, the substrate 40 may further include the insulator layer (for example, silicon dioxide) 405 on a part of surfaces of the first semiconductor fin and the second semiconductor fin. Optionally, the substrate 40 may further include the mask isolation layer 404 that is on the surface of the insulator layer 405. For example, the material of the mask isolation layer 404 may include a silicon nitride, and the like.

As shown in FIG. 4L, the semiconductor device may further include: the first source and the first drain (for example, the first source/first drain 421 shown in FIG. 4L) that are at least partially located in the first semiconductor area. For example, the first source and the first drain are at least partially located in the first semiconductor fin 4021, separately.

As shown in FIG. 4L, the semiconductor device may further include the first diffused layer 431 on the surfaces of the first source and the first drain. A conductivity type of the first diffused layer 431 is same to the conductivity types of the first source and the first drain, and a doping density of the dopant (for example, a P-typed dopant) contained in the first diffused layer 431 is separately greater than doping densities of dopants contained in the first source and the first drain. In some implementations, the conductivity types of the first source and the first drain may be P-typed, and the material of the first diffused layer 431 may include the boron-doped silicon dioxide.

As shown in FIG. 4L, the semiconductor device may further include the first barrier layer 441 on the first diffused layer 431.

As shown in FIG. 4L, the semiconductor device may further include: the second source and the second drain (for example, the second source/second drain 422 shown in FIG. 4L) that are at least partially located in the second semiconductor area (for example, the second semiconductor fin) 4022. For example, the second source and the second drain are at least partially located in the second semiconductor fin 4022, separately.

In the foregoing semiconductor device, a dopant in the first diffused layer diffuses towards to the surfaces of the first source and the first drain, so as to increase doping densities at the surfaces of the first source and the first drain. As a result, contact resistances between the first source and the first drain and corresponding contacts (which are described in the following) are reduced, thereby improving performance of a device.

Optionally, as shown in FIG. 4L, the semiconductor device may further include the second diffused layer 432 on the surfaces of the second source and the second drain. A conductivity type of the second diffused layer 432 is same to the conductivity types of the second source and the second drain, and a doping density of the dopant (for example, an N-typed dopant) contained in the second diffused layer 432 is separately greater than doping densities of dopants contained in the second source and the second drain. For example, the second diffused layer 432 may further be formed on the first barrier layer 441 that is above the first source and the first drain. In some implementations, the conductivity types of the second source and the second drain may be N-typed, and the material of the second diffused layer 432 may include the phosphorus-doped silicon dioxide.

Optionally, as shown in FIG. 4L, the semiconductor device may further include the second barrier layer 442 on the second diffused layer 432.

In some implementations, as shown in FIG. 4L, the semiconductor device may further include: the interlayer dielectric layer 45 that is formed on the second barrier layer 442 and that covers the first source, the first drain, the second source, and the second drain.

In some implementations, as shown in FIG. 4L, the semiconductor device may further include: the first source contact, the first drain contact, the second source contact, and the second drain contact (for example, the first source contact/first drain contact 471 and the second source contact/second drain contact 472 shown in FIG. 4L) that pass through the interlayer dielectric layer 45. The first source contact is connected to the first source, the first drain contact is connected to the first drain, the second source contact is connected to the second source, and the second drain contact is connected to the second drain.

In the foregoing semiconductor device, the dopant in the first diffused layer diffuses towards the surfaces of the first source and the first drain, and the dopant in the second diffused layer diffuses towards the surfaces of the second source and the second drain. Therefore, doping densities at the surfaces of the first source, the first drain, the second source, and the second drain are increased, and contact resistances between the sources or the drains and corresponding contacts are reduced, thereby improving performance of a device.

Heretofore, methods for manufacturing a semiconductor device and the formed semiconductor devices are described in detail. In describing the concepts of the present disclosure, some details generally known in the art are not described. According to the foregoing descriptions, a person skilled in the art may completely understand how to implement the technical solutions disclosed herein.

Some specific embodiments and implementations of the present disclosure are described in detail through examples. However, a person skilled in the art should understand that the foregoing examples are merely for illustration, but are not intended to limit the scope of the present disclosure. A person skilled in the art should understand that the foregoing embodiments and implementations may be modified without departing from the scope and spirit of the present disclosure. The scope of the present disclosure is defined by the appended claims.

What is claimed is:

1. A semiconductor device, comprising:
   a substrate;
   a source and a drain that are at least partially located in the substrate;
   a diffused layer on a surface of at least one of the source or the drain, wherein a conductivity type of the diffused layer is a same conductivity type as the source and the drain, and a doping density of a dopant contained in the diffused layer is separately greater than doping densities of dopants contained in the source and the drain;
   a barrier layer on the diffused layer;
   an interlayer dielectric layer that is formed on the barrier layer and that covers the source and the drain; and
   a source contact and a drain contact that pass through the interlayer dielectric layer, wherein the source contact is connected to the source, and the drain contact is connected to the drain.

2. The semiconductor device according to claim 1, wherein:
   the conductivity type of the source and the drain is N-typed, and the material of the diffused layer comprises a phosphorus-doped silicon dioxide; or
   the conductivity type of the source and the drain is P-typed, and the material of the diffused layer comprises a boron-doped silicon dioxide.

3. The semiconductor device according to claim 1, wherein the substrate comprises: a semiconductor layer and a semiconductor fin on the semiconductor layer, and
   wherein the source and the drain are at least partially located in the semiconductor fin, separately.

4. A semiconductor device, comprising:
   a substrate, wherein the substrate comprises a first semiconductor area and a second semiconductor area that are isolated, and wherein a conductivity type of the first semiconductor area is opposite to a conductivity type of the second semiconductor area;
   a first source and a first drain that are at least partially located in the first semiconductor area;
   a first diffused layer on surfaces of the first source and the first drain, wherein a conductivity type of the first diffused layer is a same conductivity type as the first source and the first drain, and a doping density of a dopant contained in the first diffused layer is separately greater than doping densities of dopants contained in the first source and the first drain;
   a first barrier layer on the first diffused layer;
   a second source and a second drain that are at least partially located in the second semiconductor area;
   a second diffused layer on surfaces of the second source and the second drain, wherein a conductivity type of the second diffused layer is the same conductivity type as the second source and the second drain, and a doping density of a dopant contained in the second diffused layer is separately greater than doping densities of dopants contained in the second source and the second drain; and
   a second barrier layer on the second diffused layer;
   wherein the second diffused layer is further formed on the first barrier layer above the first source and the first drain.

5. The semiconductor device according to claim 4, wherein:
- the conductivity type of the first source and the first drain is P-typed, and the material of the first diffused layer comprises a boron-doped silicon dioxide; and
- the conductivity type of the second source and the second drain is N-typed, and the material of the second diffused layer comprises a phosphorus-doped silicon dioxide.

6. The semiconductor device according to claim 4, further comprising:
- an interlayer dielectric layer that is formed on the second barrier layer and that covers the first source, the first drain, the second source, and the second drain; and
- a first source contact, a first drain contact, a second source contact, and a second drain contact that pass through the interlayer dielectric layer, wherein the first source contact is connected to the first source, the first drain contact is connected to the first drain, the second source contact is connected to the second source, and the second drain contact is connected to the second drain.

7. The semiconductor device according to claim 4, wherein
- the first semiconductor area is a first semiconductor fin, and the second semiconductor area is a second semiconductor fin;
- the substrate further comprises a semiconductor layer, wherein both the first semiconductor fin and the second semiconductor fin are on the semiconductor layer;
- the first source and the first drain are at least partially located in the first semiconductor fin, separately; and
- the second source and the second drain are at least partially located in the second semiconductor fin, separately.

* * * * *